US009294110B1

(12) United States Patent
Pullen et al.

(10) Patent No.: US 9,294,110 B1
(45) Date of Patent: Mar. 22, 2016

(54) CORRECTION CIRCUITS FOR SUCCESSIVE-APPROXIMATION-REGISTER ANALOG-TO-DIGITAL CONVERTERS

(71) Applicant: QUALCOMM Incorporated, San Diego, CA (US)

(72) Inventors: Stuart Pullen, Raleigh, NC (US); William Rader, Carrboro, NC (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/608,928

(22) Filed: Jan. 29, 2015

(51) Int. Cl.
*H03M 1/06* (2006.01)
*H02M 3/157* (2006.01)
*H03M 1/34* (2006.01)
*H03M 1/12* (2006.01)

(52) U.S. Cl.
CPC ............ *H03M 1/0609* (2013.01); *H02M 3/157* (2013.01); *H03M 1/129* (2013.01); *H03M 1/34* (2013.01)

(58) Field of Classification Search
None
See application file for complete search history.

(56) References Cited

U.S. PATENT DOCUMENTS

| | | | |
|---|---|---|---|
| 7,141,955 B1 * | 11/2006 | Martinez ............ | H03K 17/0822 307/66 |
| 7,262,628 B2 | 8/2007 | Southwell et al. | |
| 7,466,116 B2 | 12/2008 | Sato et al. | |
| 7,978,112 B2 * | 7/2011 | Terranova ........... | H03M 1/0604 341/120 |
| 8,564,470 B2 * | 10/2013 | Bogner ................... | H03M 1/46 341/155 |
| 2013/0082675 A1 * | 4/2013 | Capodivacca .......... | G05F 1/468 323/283 |
| 2013/0207627 A1 * | 8/2013 | Kahn ........................ | G05F 1/46 323/271 |

OTHER PUBLICATIONS

Liu, S., Selection of Three Locations of Current Sense Resistor in Buck Converter, Alpha & Omega Semiconductor, Ltd., Application Note PIC-007, http://aosmd.com/res/application_notes/power-ics/PIC-007.pdf.*
Aiello O., et al., "A New Mirroring Circuit for Power MOS Current Sensing Highly Immune to EMI," Sensors, 2013, vol. 13 (2), pp. 1856-1871.
Liu S., "Selection of Three Locations of Current Sense Resistor in Buck Converter," Application Note PIC-007, Aug. 2008, 5 pages. Alpha & Omega Semiconductor, Inc. http://aosmd.com/res/application_notes/power-ics/PIC-007.pdf.
LM5642/LM5642X High Voltage, Dual Synchronous Buck Converter with Oscillator Synchronization, National Semiconductor Corporation, Jun. 2007, 28 pages.

* cited by examiner

*Primary Examiner* — Howard Williams
(74) *Attorney, Agent, or Firm* — Fountainhead Law Group P.C.

(57) ABSTRACT

In one embodiment, a correction circuit comprises circuit comprises a replica transistor biased at a current density to match that of a high side transistor of an output power switch at a specific load. A sample and hold circuit is coupled to the replica transistor to sample a voltage across the replica transistor. A differential amplifier provides a level shifted differential replica voltage to a tap of a resistor ladder of a successive approximation register analog-to-digital converter in response to the sampled voltage across the replica transistor. A current source provides a current to a top of the resistor ladder.

19 Claims, 5 Drawing Sheets

CORRECTION CIRCUITS FOR SUCCESSIVE-APPROXIMATION-REGISTER ANALOG-TO-DIGITAL CONVERTERS

BACKGROUND

The disclosure relates to correction circuits, and in particular, to correction circuits for successive-approximation-register analog-to-digital converters.

Unless otherwise indicated herein, the approaches described in this section are not admitted to be prior art by inclusion in this section.

High frequency buck converters have very short high side on-times, so that often less than 10 nanoseconds is provided to measure current across the high side field effect transistor (FET) of the switching driver, thereby making the use of traditional current sense amplifiers ineffective. Often a replica FET is used to measure current in the power FET. The replica FET has a reference current that sets up a current density identical to that in the power FET at current limit and the differential drain-source voltage Vds across this replica FET is buffered and differentially applied to a digital-to-analog (DAC) in a successive-approximation-register (SAR) analog-to-digital converter (ADC) as its full scale reference. The input to the SAR ADC is the Vds voltage across the power FET as an indication of the current. However, the on-resistance Ron of the power FET is not linear. Even with a constant gate-source voltage Vgs, the on-resistance Ron of the FET varies with Vds.

The ADC can only compensate for Vds non-linearity for currents near the current limit. At currents less than the current limit, the ADC reports current values much lower than the actual currents in the power FET. These errors can approach 15% and when added to the other system errors quickly make the tolerance of the ADC quite poor.

SUMMARY

The present disclosure relates to correction circuits for successive-approximation-register analog-to-digital converters In one embodiment, a correction circuit comprises a replica transistor biased at a current density to match that of a high side transistor of an output power switch at a specific load. A sample and hold circuit is coupled to the replica transistor to sample a voltage across the replica transistor. A differential amplifier provides a level shifted differential replica voltage to a tap of a resistor ladder of a successive approximation register analog-to-digital converter in response to the sampled voltage across the replica transistor. A current source provides a current to a top of the resistor ladder.

In one embodiment, the replica transistor is a field effect transistor and the high side transistor is a field effect transistor.

In one embodiment, the differential amplifier has a gain to adjust an output of the resistor ladder to more closely match a drain-source current-drain-source voltage characteristics of the high side transistor in a portion of a triode region of the high side transistor.

In one embodiment, the specified load is one fourth of current limit or a boundary between the linear and triode regions of the high side transistor.

In another embodiment, a correction circuit comprises a first replica transistor biased at a current density to match a current density of a high side transistor of an output power switch. A second replica transistor biased at a current to match the current density of the high side transistor at or near current limit. The first replica transistor is biased at a lower current density than the current density of the second replica transistor. A first differential amplifier provides a first signal to a tap of a resistor ladder of a successive approximation register analog-to-digital converter in response to a voltage across the first replica transistor. A second differential amplifier provides a second signal to a top of the resistor ladder in response to a voltage across the second replica transistor.

In one embodiment, the first replica transistor is a field effect transistor, the second replica transistor is a field effect transistor, and the high side transistor is a field effect transistor.

In one embodiment, the specified load is one fourth of current limit or a boundary between the linear and triode regions of the high side transistor.

In one embodiment, the first differential amplifier has a gain to adjust the output of the resistor ladder to more closely match drain-source current-drain-source voltage characteristics of the high side transistor in a portion of a triode region of the high side transistor.

In one embodiment, the second differential amplifier has a gain to adjust the output of the resistor ladder to more closely match drain-source current-drain-source voltage characteristics of the high side transistor in a portion of the triode region of the high side transistor.

In yet another embodiment, a method comprises detecting a voltage across a replica transistor that mirrors current of a high side transistor of an output power switch; providing a signal to a tap of a resistor ladder of a successive approximation register (SAR) analog-to-digital converter (ADC) in response to the detected voltage across the replica transistor; and providing a current to a top of the resistor ladder.

In one embodiment, detecting a voltage across a replica transistor includes sampling and holding the voltage.

In one embodiment, the replica transistor is a field effect transistor and the high side transistor is a field effect transistor.

In one embodiment, the first replica transistor operates in a linear region and the second replica transistor operates in a triode region.

In one embodiment, providing a signal to a tap of a resistor ladder includes amplifying the signal to adjust an output of the resistor ladder to more closely match drain-source current-drain-source voltage characteristics of the high side transistor in a portion of a triode region of the high side transistor.

In yet another embodiment, a method comprises detecting a first voltage across a first replica transistor that mirrors current of a high side transistor of an output power switch; detecting a second voltage across a second replica transistor that mirrors current in the high side transistor of the output power switch; providing a first signal to a tap of a resistor ladder of a successive approximation register analog-to-digital converter in response to the detected first voltage across the first replica transistor; and providing a second signal to a top of the resistor ladder of the successive approximation register analog-to-digital converter in response to the detected second voltage across the second replica transistor.

In one embodiment, the first replica transistor is a field effect transistor, the second replica transistor is a field effect transistor, and the high side transistor is a field effect transistor.

In one embodiment, providing a first signal to a tap of a resistor ladder includes amplifying the first signal to adjust an output of the resistor ladder to more closely match drain-source current-drain-source voltage characteristics of the high side transistor in a portion of a triode region of the high side transistor.

In one embodiment, providing a second signal to a top of a resistor ladder includes amplifying the second signal to adjust an output of the resistor ladder to more closely match drain-source current-drain-source voltage characteristics of the high side transistor in a portion of a triode region of the high side transistor.

In one embodiment, the portion of a triode region of the high side transistor is a middle portion of the triode region.

The following detailed description and accompanying drawings provide a better understanding of the nature and advantages of the present disclosure.

BRIEF DESCRIPTION OF THE DRAWINGS

With respect to the discussion to follow and in particular to the drawings, it is stressed that the particulars shown represent examples for purposes of illustrative discussion, and are presented in the cause of providing a description of principles and conceptual aspects of the present disclosure. In this regard, no attempt is made to show implementation details beyond what is needed for a fundamental understanding of the present disclosure. The discussion to follow, in conjunction with the drawings, make apparent to those of skill in the art how embodiments in accordance with the present disclosure may be practiced. In the accompanying drawings.

DETAILED DESCRIPTION

In the following description, for purposes of explanation, numerous examples and specific details are set forth in order to provide a thorough understanding of the present disclosure. It will be evident, however, to one skilled in the art that the present disclosure as expressed in the claims may include some or all of the features in these examples, alone or in combination with other features described below, and may further include modifications and equivalents of the features and concepts described herein.

Figure 1:
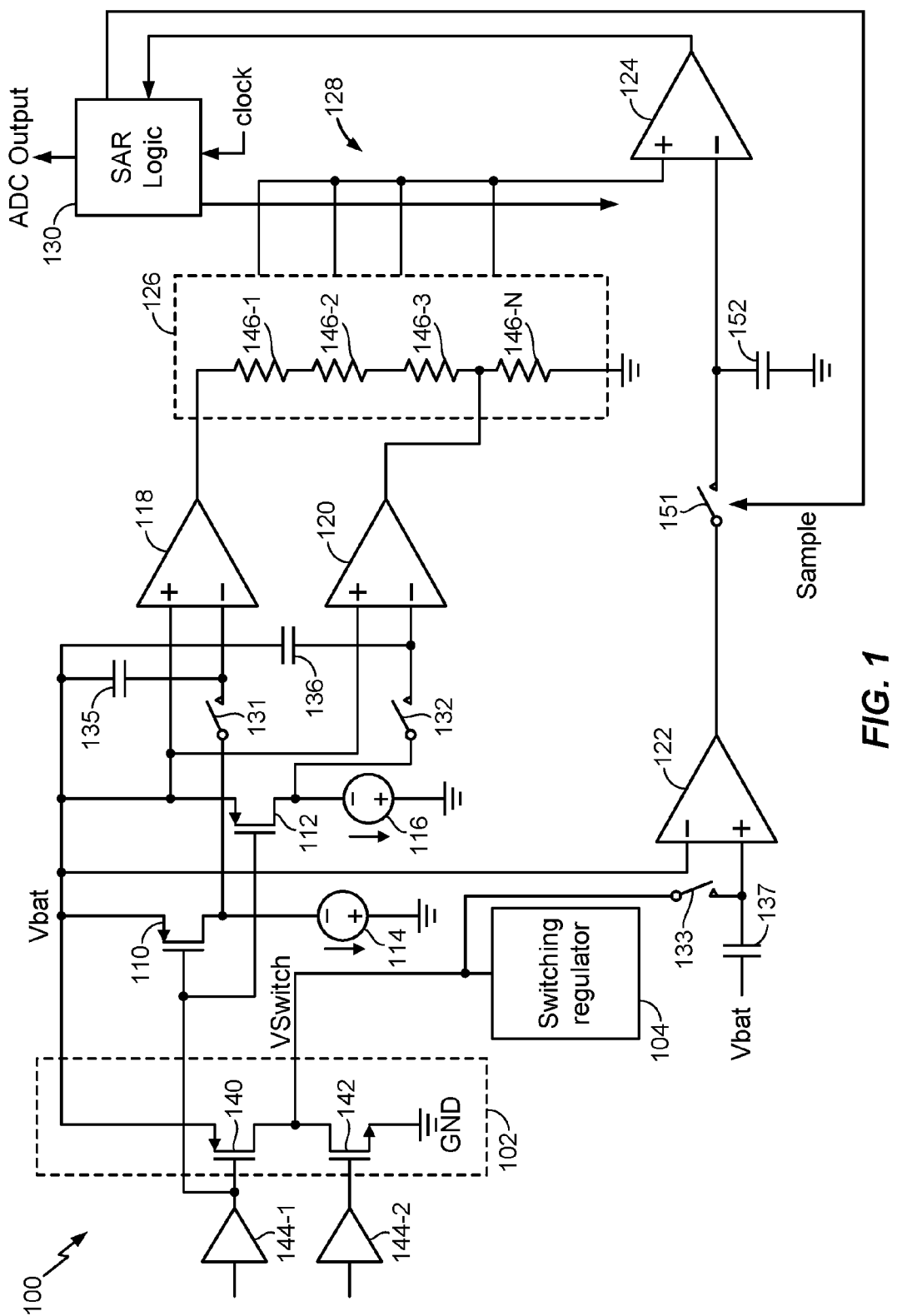
FIG. 1 is a block diagram illustrating a current correction circuit according to some embodiments.

FIG. 1 is a block diagram illustrating a current correction circuit 100 according to some embodiments. Current correction circuit 100 senses current in an output power switch 102 that drives a switching regulator 104, such as a buck converter. Although current correction circuit 100 is described for a battery voltage Vbat, other sources of voltage may be used. Current correction circuit 100 comprises a plurality of replica transistors 110 and 112, a plurality of current sources 114 and 116, a plurality of differential amplifiers 118, 120, and 122, a plurality of switches 131, 132 and 133, and a plurality of capacitors 135, 136, and 137. A comparator 124, a resistor ladder 126, a switching circuit 128, a successive approximation register (SAR) logic circuit 130, a switch 151, and a capacitor 152 are arranged as a successive approximation register (SAR) analog-to-digital converter (ADC).

Output power switch 102 comprises a high side switching power transistor 140 and a low side switching power transistor 142. High side switching power transistor 140 is driven by a switching driver 144-1. Low side switching power transistor 142 is driven by a switching driver 144-2.

In various embodiments, replica transistors 110 and 112 are field effect transistors (FETs), and, are referred to as replica FETS 110 and 112, respectively, in the description below. Replica FET 110 operates in a region of the triode region at which the drain current curvature is substantially linear, and replica FET 112 operates in a region of the triode region that has more curvature or is not substantially linear. Replica FETS 110 and 112 and current sources 114 and 116 provide temperature correction and voltage Vds correction of high side power transistor 140. Replica FET 110 is sourced by current source 114 with a current so that the voltage VDS of replica FET 110 may equal the voltage Vds of high side power transistor 140 at the current limit Replica FETs 110 and 112 are sized to produce currents therein that are scaled down (e.g., on the order of 1/10,000) from the current in the high side power transistor 140. Current sources 114 and 116 are sized to set the relative currents so that current source 114 provides a current that is larger than the current provided by current source 116. In this example, current source 114 provides a current of 228 micro-amps, which is 4 times the current of 57 micro-amps provided by current source 116. In some embodiments, replica FET 112 is biased at a current density that is lower than the current density of replica FET 110, so that the current density of replica FET 112 matches the current density of high side power transistor 140 at a lower current than the replica FET 110. Replica FET 112 can be biased in the upper regions of the linear region or the lower region of the triode or any specific current of interest for desired high accuracy if replica FET 112 is biased at a current lower than the current limit of second replica FET 110.

The voltages Vds of the replica FETs 110 and 112 are level shifted by differential amplifiers 118 and 120, respectively. Differential amplifier 118 generates a reference signal that is provided to the top of resistor ladder 126 in response to the voltage Vds of replica FET 110. Differential amplifier 120 generates a reference signal that is provided to a tap of resistor ladder 126 in response to the voltage Vds of replica FET 112. The reference signal generated by differential amplifier 120 functions as a reference voltage of resistor ladder 126 and the SAR ADC. Resistor ladder 126 comprises a plurality of series connected resistors 146-1 through 146-N. The output of differential amplifier 120 is provided to a tap of resistor ladder 126. In this example, the tap is the 25% point. The tap point may be selected based on the desired piecewise linearity. The ADC compares selected tapped outputs of resistor ladder 126 to the ADC input (the sampled output of differential amplifier 122) for a successive approximation ADC operation. In this example, SAR logic circuit 130 is 7 bits, but for simplicity only 4 resistors are shown in the SAR DAC.

Figure 2:
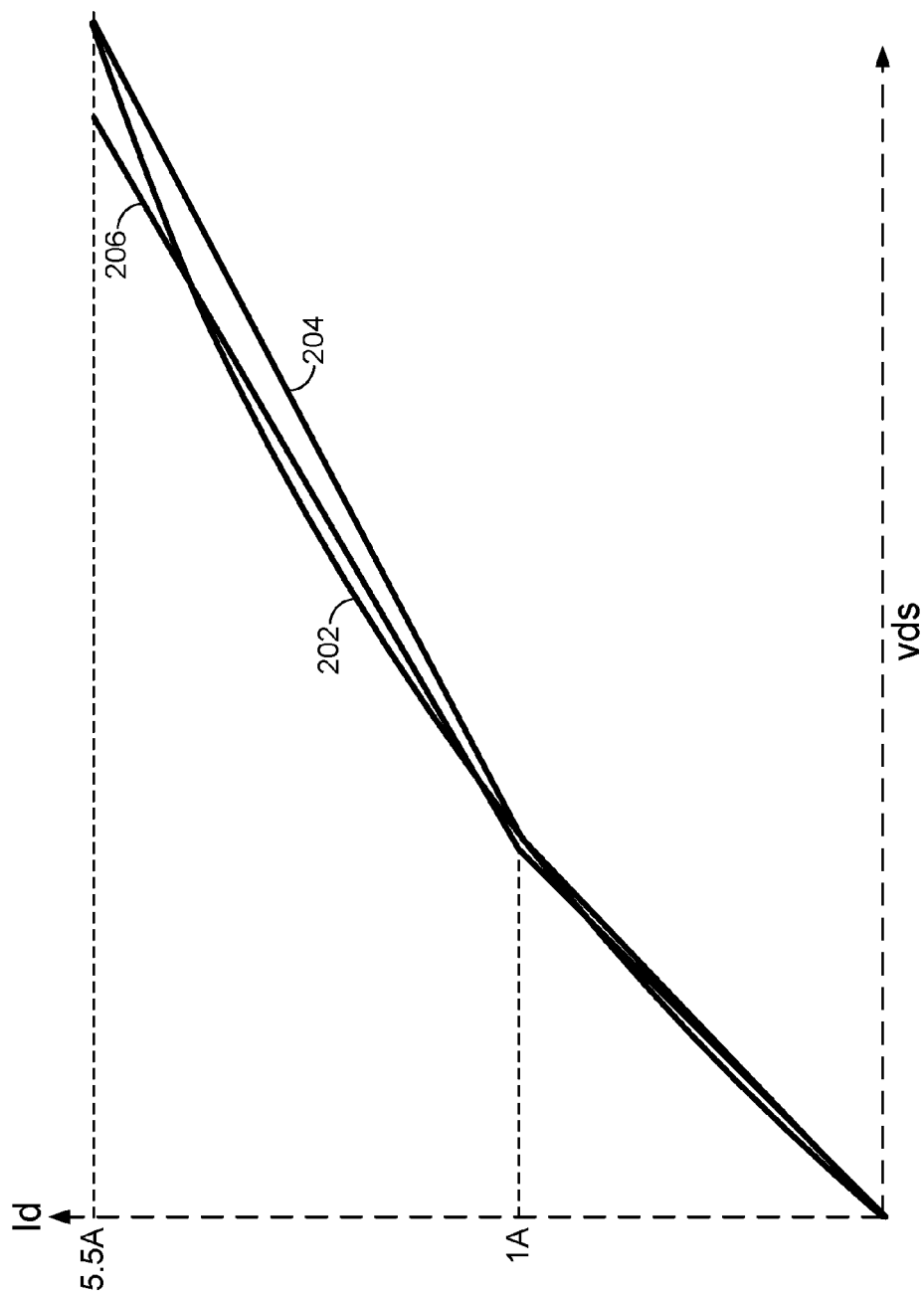
FIG. 2 is a graph illustrating the current through replica transistors as a function of drain-source voltage Vds according to some embodiments.

Differential amplifiers 118 and 120 level shift the measured voltage Vds to reference to ground instead of the supply voltage or battery voltage Vbat. Differential amplifiers 118 and 120 may have a gain other than one. In this example, differential amplifiers 118 and 120 have a gain of 1.5 to adjust the Ids-Vds curve as shown in FIG. 2. Differential amplifier 118, switch 131 and capacitor 135 are configured as a sampler and low pass filter of drain voltage replica FET 110. Differential amplifier 120, switch 132 and capacitor 136 are configured as a sampler and low pass filter of drain voltage replica FET 112.

Differential amplifier 122, switch 133 and capacitor 137 are configured as a sampler and low pass filter of the output voltage Vswitch of the output power switch 102. Differential amplifier 122 detects the voltage Vds across high side power transistor 140 that corresponds to the current through high side power transistor 140. The output of differential amplifier 122 is applied to the inverting input of comparator 124, and compared by comparator 124 to an output of switching circuit 128. SAR logic circuit 130 operates in response to a clock signal, which, in this example, is 38.4 Megahertz. Comparator 124, switch 151 and capacitor 152 are configured as a sampler and low pass filter of the output of differential amplifier 122 in response to a switch signal from SAR logic circuit 130. SAR logic circuit 130 controls the sample switch 151 so that after the conversion is complete and a valid code is outputted as ADC output, another sample is taken. Switches 131, 132 and 137 are closed with the high side power transistor is on. SAR logic circuit 130 controls switching circuit 128 for sampling taps of resistor ladder 126, which are applied to the non-inverting input of comparator 124 for the successive approximation.

Differential amplifiers 118, 120 and 122 or current correction circuit 100 may include circuitry for auto-calibration. Differential amplifiers 118, 120 and 122 or current correction circuit 100 may include circuitry for sampling and hold the drain-source voltage Vds across the corresponding transistor. Output power switch 102 may switch at a high frequency (e.g., 5 Megahertz) so that high side power transistor 140 is on for relatively short times. The voltage Vds typically has high ringing. The sampling and holding may account for the ringing by turning on the sample switches after PMOS 140 has been on for several nanoseconds.

Comparator 124 or current correction circuit 100 may include circuitry for auto-zero or other methods to achieve extremely low offset or noise or both.

If gain is applied in differential amplifiers 118 and 120, the currents in current sources 114 and 116 are reduced by the same amount. If the gain is 1.25, then the replica currents should be 0.8 of the replica current would have been with a gain of 1.

Although current correction circuit 100 is described for two replica FETs, other numbers of replica FETS may be used. Single replica FET embodiments are described below in conjunction with FIG. 3. More than two replica FETS and corresponding differential amplifiers may be used to increase the piecewise linearity tracking of the high side power transistor 140. The outputs of the differential amplifiers may be provided to corresponding taps of resistor ladder 126.

FIG. 2 is a graph illustrating the current through replica transistors 110 and 112 as a function of drain-source voltage Vds according to some embodiments. Line 202 is the Ids-Vds curve for a replica FET. Line 202 is more linear for lower values of voltage Vds with more curvature as the voltage Vds approaches a maximum current (in this example, 5.5 Amps). In a triode region (here above 1 Amp), line 202 is non-linear. The non-linearity of line 202, and thus the curvature of line 202, increases with increasing drain-source voltage Vds. Line 204 is the drain-source current Ids-drain-source voltage Vds line that is detected by replica FETS 110 and 112, but are not gain adjusted by differential amplifiers 118 and 120 (gain equals 1). Lines 204 and 206 represent the characteristics of the SAR ADC. Line 204 is linear in the triode region, but differs significantly from line 202 in the middle of the triode region. Amplifying the detected drain-source voltage Vds moves the drain-source current Ids-drain-source voltage Vds curve and produces line 206, which is linear in the triode region, so that line 202 is closer to line 206 than line 204. Thus, line 206 is a better approximation of line 202 than line 204 in the middle part of the triode region. Line 206 is centered the error around zero.

Current correction circuit 100 uses a piecewise linear approach to drive the SAR DAC for improving non-linearity error. As shown in FIG. 2, the voltage Vds error is adjusted to zero at the current limit and at the tap point (in this example, the one-fourth or 25% point. For all other currents the DAC voltages are too high and the ADC output is systematically too low. The gain of differential amplifiers 118 and 120 are adjusted to shift the linear relationship (as shown by line 206) to center the systematic error and thereby reduce the systematic error.

The reference currents are reduced and gain is added to drive the same DAC tap points. This effectively lowers the resistance of replica FETs 110 and 112 (because a lower Vds due to a lower current leads to less resistance) and centers the error curve.

Figure 3:
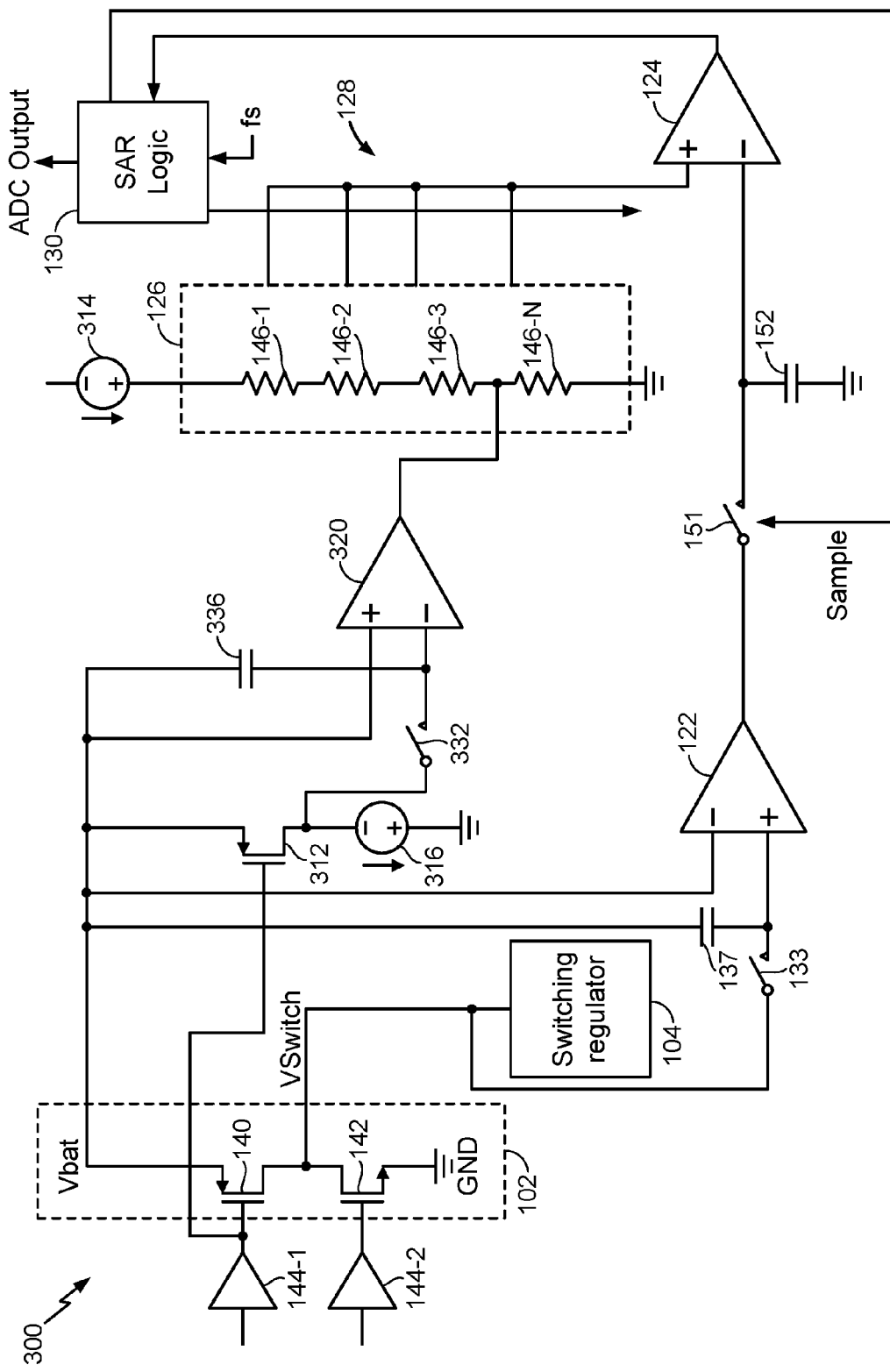
FIG. 3 is a block diagram illustrating a current correction circuit according to some other embodiments.

FIG. 3 is a block diagram illustrating a current correction circuit 300 according to some other embodiments. Current correction circuit 300 uses a single differential amplifier to detect the drain-source voltage Vds across the replica FET. Current correction circuit 300 may be used in systems that need accuracy only at low currents.

The differential amplifier provides the output to a tap on the resistor ladder of the ADC. In this embodiment, current source 314 provides current to resistor ladder 146 to set the reference. The ADC operates in a similar manner as the ADC in FIG. 1.

Current correction circuit 300 senses current in an output power switch 102 that drives a switching regulator 104, such as a buck converter. Although current correction circuit 300 is described for a battery voltage Vbat, other sources of voltage may be used. Current correction circuit 300 comprises a replica transistor 312, a plurality of current sources 314 and 316, a plurality of differential amplifiers 320 and 122, a plurality of switches 332 and 133, and a plurality of capacitors 336 and 137. A comparator 124, a resistor ladder 126, a switching circuit 128, a successive approximation register (SAR) logic circuit 130, a switch 151, and a capacitor 152 are arranged as a successive approximation register (SAR) analog-to-digital converter (ADC) that operates in a similar manner as described above in conjunction with FIG. 1. Differential amplifier 122 operates in a similar manner as described above in conjunction with FIG. 1.

In various embodiments, replica transistor 312 is a field effect transistor (FETs), and, is referred to as replica FET 312 in the description below. Replica FET 312 is sourced by current source 316 with a current so that the drain-source voltage VDS of replica FET 312 equals the drain-source voltage Vds of high side power transistor 140 at the current limit divided by 4, in this example. In this example, current source 316 provides a current of 57 micro-amps. The drain-source voltage Vds of replica FET 312 is level shifted by differential amplifier 320. Current source 314 provides a reference current to the top of resistor ladder 126. In this example, the reference current is selected based on not saturating comparator 124. Differential amplifier 320 generates a reference signal that is provided to a tap of resistor ladder 126 in response to the drain-source voltage Vds of replica FET 312. Resistor ladder 126 provides temperature compensation for taps below the tap coupled to differential amplifier 320. In this example, the tap is the 25% point. The tap point may be selected based on the desired piecewise linearity. The SAR ADC compares selected tapped outputs of resistor ladder 126 to the sampled and level shifted Vswitch voltage for a successive approximation ADC operation.

Differential amplifier 320 detects the voltage across replica FET 312. Differential amplifier 120 level shifts the measured drain-source voltage Vds to reference to ground instead of the supply voltage or battery voltage Vbat. Differential amplifier 320 may have a gain other than one. In this example, differential amplifier 320 has a gain of 1.5 to adjust the drain-source current Ids-drain-source voltage Vds curve in a similar manner to the adjustment shown in FIG. 2 for current correction circuit 100. Differential amplifier 320, switch 332 and capacitor 336 are configured as a sampler and low pass filter of drain voltage replica FET 312.

Differential amplifier 320 or current correction circuit 300 may include circuitry for auto-calibration. Differential amplifier 320 or current correction circuit 300 may include circuitry for sampling and hold.

The current correction circuits 100 and 300 with drain-source on-resistance RDSon sensing of the high side power transistor may increase the accuracy of the SAR ADC in high frequency bucks. This may be very useful for applications that use real time current information (such as current sharing in multi-phase systems).

Figure 4:
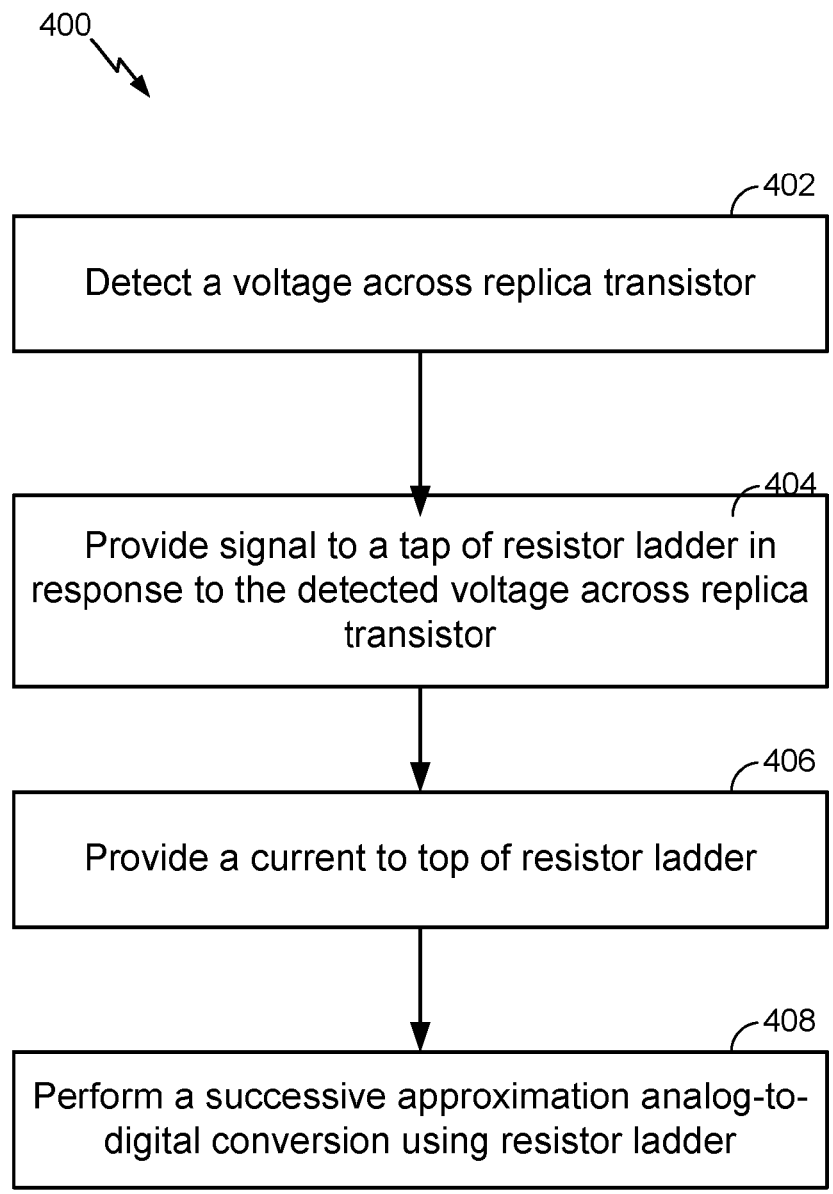
FIG. 4 is a simplified diagram illustrating a process flow for correcting current according to some embodiments.

FIG. 4 is a simplified diagram illustrating a process flow 400 for correcting current according to some embodiments. Process flow 400 is described for current correction circuit 300, but may be performed with other correction circuits.

At 402, a voltage across replica transistor 312 that matches the current density of the high side transistor 140 at a specific load, such as one-fourth of current limit of output power switch 102, is detected. At 404, a signal to a tap of resistor ladder 126 of a SAR ADC is provided in response to the detected voltage across replica transistor 312. The signal may be amplified to adjust an output of resistor ladder 126 to more closely match drain-source current-drain-source voltage characteristics of high side transistor 140 in a portion of a triode region of high side transistor 140. The portion of a triode region of high side transistor may be a middle portion of the triode region. At 406, a current is provided to a top of resistor ladder 126. At 408, a successive approximation analog-to-digital conversion is performed using resistor ladder 126.

Figure 5:
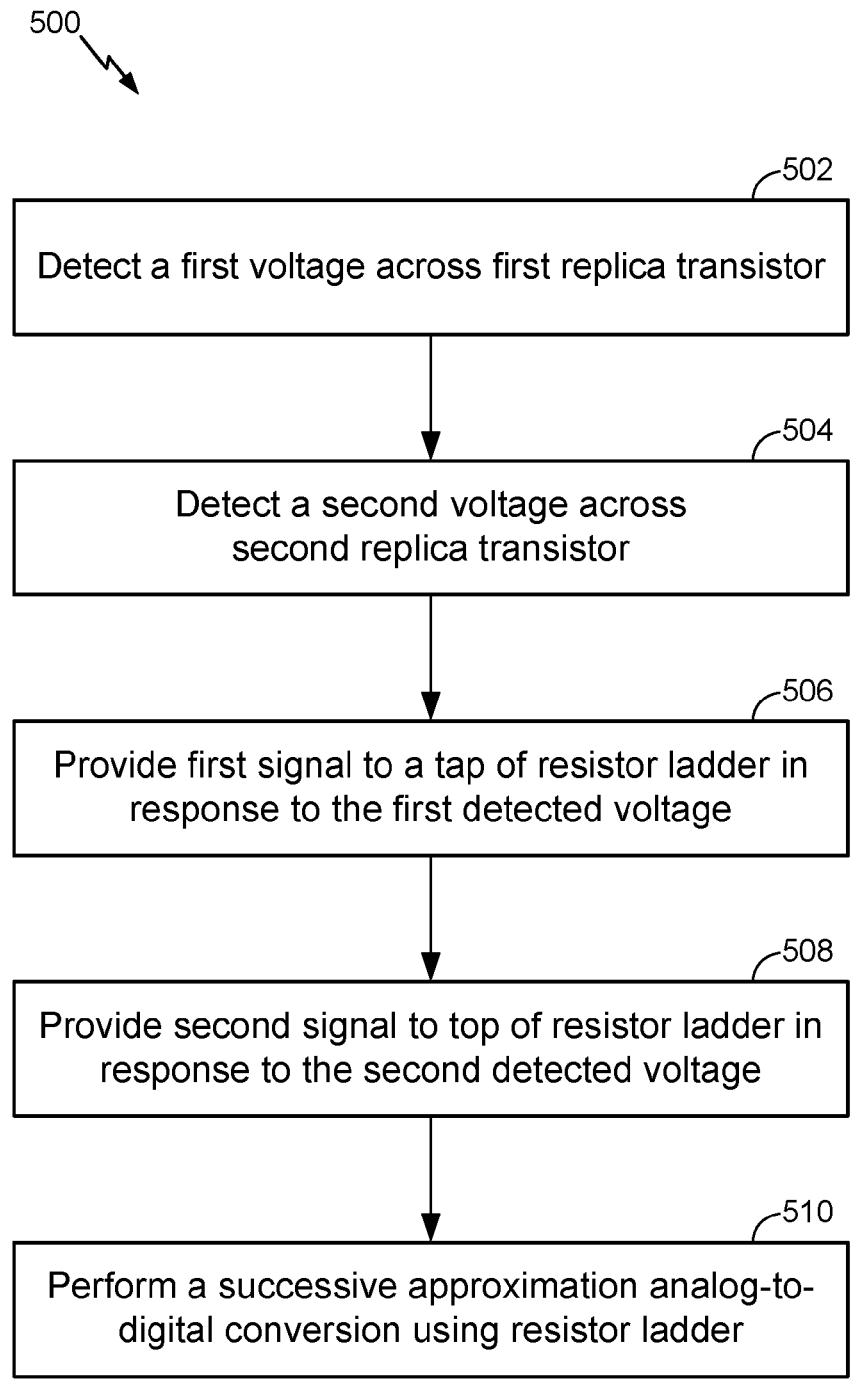
FIG. 5 is a simplified diagram illustrating a process flow for correcting current according to some other embodiments.

FIG. 5 is a simplified diagram illustrating a process flow 500 for correcting current according to some embodiments. Process flow 500 is described for current correction circuit 100, but may be performed with other correction circuits.

At 502, a first voltage across first replica transistor 112 that mirrors current of high side transistor 140 of output power switch 102 is detected; At 504, a second voltage across second replica transistor 110 that mirrors current of high side transistor 140 of output power switch 102 is detected. At 506, a first signal to a tap of resistor ladder 126 of a successive approximation register analog-to-digital converter in response to the detected first voltage across first replica transistor 112. The first signal may be amplified to adjust an output of resistor ladder 126 to more closely match drain-source current-drain-source voltage characteristics of high side transistor 140 in a portion of a triode region of high side transistor 140. The portion of a triode region of high side transistor may be a middle portion of the triode region. At 508, a second signal to a top of resistor ladder 126 of the successive approximation register analog-to-digital converter in response to the detected second voltage across second replica transistor 110. The second signal may be amplified to adjust an output of resistor ladder 126 to more closely match drain-source current-drain-source voltage characteristics of high side transistor 140 in a portion of a triode region of high side transistor 140. The portion of a triode region of high side transistor may be a middle portion of the triode region. At 510, a successive approximation analog-to-digital conversion is performed using resistor ladder 126.

The switches described herein may be implemented by one or more transistors.

The above description illustrates various embodiments of the present disclosure along with examples of how aspects of the particular embodiments may be implemented. The above examples should not be deemed to be the only embodiments, and are presented to illustrate the flexibility and advantages of the particular embodiments as defined by the following claims. Based on the above disclosure and the following claims, other arrangements, embodiments, implementations and equivalents may be employed without departing from the scope of the present disclosure as defined by the claims.

What is claimed is:

1. A correction circuit comprising:
   a replica transistor biased at a current density to match that of a high side transistor of an output power switch at a specific load;
   a sample and hold circuit coupled to the replica transistor to sample a voltage across the replica transistor;
   a differential amplifier to provide a level shifted differential replica voltage to a tap of a resistor ladder of a successive approximation register analog-to-digital converter in response to the sampled voltage across the replica transistor; and
   a current source to provide a current to a top of the resistor ladder.

2. The correction circuit of claim 1 wherein the replica transistor is a field effect transistor and the high side transistor is a field effect transistor.

3. The correction circuit of claim 2 wherein the differential amplifier has a gain to adjust an output of the resistor ladder to more closely match drain-source current-drain-source voltage characteristics of the high side transistor in a portion of a lower triode region or an upper linear region of the high side transistor.

4. The correction circuit of claim 1 wherein the specified load is one fourth of a current limit or a boundary between the linear and triode regions of the high side transistor.

5. A correction circuit comprising:
   a first replica transistor biased at a current density to match a current density of a high side transistor of an output power switch at a much lower current;
   a second replica transistor biased at a current density to match the current density of the the high side transistor at or near the current limit, the first replica transistor being biased at a lower current density than the current density of the second replica transistor;
   a first differential amplifier to provide a first signal to a tap of a resistor ladder of the successive approximation register analog-to-digital converter in response to a voltage across the first replica transistor; and
   a second differential amplifier to provide a second signal to a top of the resistor ladder of the successive approximation register analog-to-digital converter in response to a voltage across the second replica transistor.

6. The correction circuit of claim 5 wherein the first replica transistor is a field effect transistor, the second replica transistor is a field effect transistor, and the high side transistor is a field effect transistor.

7. The correction circuit of claim 6 wherein the first replica transistor operates in a substantially linear region and the second replica transistor operates in a portion of a triode region that is not substantially linear.

8. The correction circuit of claim 5 wherein the first differential amplifier has a gain to adjust the output of the resistor ladder to more closely match drain-source current-drain-source voltage characteristics of the high side transistor in a portion of a triode region of the high side transistor.

9. The correction circuit of claim 8 wherein the second differential amplifier has a gain to adjust the output of the resistor ladder to more closely match drain-source current-drain-source voltage characteristics of the high side transistor in a portion of the triode region of the high side transistor.

10. A method comprising:
   detecting a voltage across a replica transistor that mirrors current of a high side transistor of an output power switch;
   providing a signal to a tap of a resistor ladder of a successive approximation register (SAR) analog-to-digital converter (ADC) in response to the detected voltage across the replica transistor; and
   providing a current to a top of the resistor ladder.

11. The method of claim 10 wherein detecting a voltage across a replica transistor includes sampling and holding the voltage.

12. The method of claim 10 wherein the replica transistor is a field effect transistor and the high side transistor is a field effect transistor.

13. The method of claim 10 wherein providing a signal to a tap of a resistor ladder includes amplifying the signal to adjust an output of the resistor ladder to more closely match drain-source current-drain-source voltage characteristics of the high side transistor in a portion of a triode region of the high side transistor wherein the portion of a triode region of the high side transistor is a middle portion of the triode region.

14. A method comprising:
   detecting a first voltage across a first replica transistor that mirrors current of a high side transistor of an output power switch;
   detecting a second voltage across a second replica transistor that mirrors current in the high side transistor of the output power switch;
   providing a first signal to a tap of a resistor ladder of a successive approximation register analog-to-digital converter in response to the detected first voltage across the first replica transistor; and
   providing a second signal to a top of the resistor ladder of the successive approximation register analog-to-digital converter in response to the detected second voltage across the second replica transistor.

15. The method of claim 14 wherein the first replica transistor is a field effect transistor, the second replica transistor is a field effect transistor, and the high side transistor is a field effect transistor.

16. The method of claim 15 further comprising:
   operating the first replica transistor in a substantially linear region: and
   operating the second replica transistor in a portion of a triode region that is not substantially linear.

17. The method of claim 14 wherein providing a first signal to a tap of the resistor ladder includes amplifying the first signal to adjust an output of the resistor ladder to more closely match drain-source current-drain-source voltage characteristics of the high side transistor in a portion of a triode region of the high side transistor.

18. The method of claim 17 wherein providing a second signal to a top of the resistor ladder includes amplifying the second signal to adjust an output of the resistor ladder to more closely match drain-source current-drain-source voltage characteristics of the high side transistor in a portion of a triode region of the high side transistor.

19. The method of claim 18 wherein the portion of a triode region of the high side transistor is a middle portion of the triode region.

* * * * *